United States Patent
Schmidt et al.

(10) Patent No.: US 6,864,751 B1
(45) Date of Patent: Mar. 8, 2005

(54) TRANSIMPEDANCE AMPLIFIER WITH ADJUSTABLE OUTPUT AMPLITUDE AND WIDE INPUT DYNAMIC-RANGE

(75) Inventors: Lothar Schmidt, Rodenberg (DE); Karlheinz Muth, Hannover (DE); Martin Braier, Hannover (DE)

(73) Assignee: Texas Instruments Deutschland GmbH, Freising (DE)

( * ) Notice: Subject to any disclaimer, the term of this patent is extended or adjusted under 35 U.S.C. 154(b) by 10 days.

(21) Appl. No.: 10/657,528

(22) Filed: Sep. 8, 2003

(51) Int. Cl.[7] .................................................. H03F 3/04
(52) U.S. Cl. .......................................... 330/311; 330/98
(58) Field of Search .................................. 330/311, 310, 330/98, 100, 85, 290, 293

(56) References Cited

U.S. PATENT DOCUMENTS

| | | | | |
|---|---|---|---|---|
| 5,352,992 A | * | 10/1994 | Asazawa | 330/310 |
| 5,691,670 A | * | 11/1997 | Lohninger | 331/96 |
| 6,114,913 A | * | 9/2000 | Entrikin | 330/308 |

* cited by examiner

Primary Examiner—Henry Choe
(74) Attorney, Agent, or Firm—Bret J. Petersen; W. James Brady, III; Frederick J. Telecky, Jr.

(57) ABSTRACT

A transimpedance amplifier circuit comprising transistors, a constant current source, a load resistor, and the feedback resistor with a shunt circuitry consisting of the additional transistors, which are driven for example with electrically adjustable voltage sources. In a bipolar npn implementation the amplifier stage consists of a common emitter input transistor Q1, a transistor Q2 with its base connected to the collector of the first transistor operates as an emitter follower. A resistor RF connected between the emitter of said second transistor and the base of said first transistor provides a voltage controlled current feedback from the amplifier output to its input. The output voltage VOUT is generated at the emitter node of said second transistor. A shunt circuitry consists of a third and a fourth transistor Q3 and Q4 connected in shunt across resistor RF. In an embodiment, the base node voltages of the transistors Q3 and Q4 are adjusted by control voltage sources. By means of an appropriate implementation of these voltage sources the maximum and minimum limits of the output voltage VOUT is defined, which can easily be implemented with arbitrary temperature or supply voltage dependency.

25 Claims, 4 Drawing Sheets

TRANSIMPEDANCE AMPLIFIER WITH ADJUSTABLE OUTPUT AMPLITUDE AND WIDE INPUT DYNAMIC-RANGE

TECHNICAL FIELD OF THE INVENTION

In general this invention applies to analog electronic circuits. More particularly it relates to transimpedance amplifiers.

BACKGROUND OF THE INVENTION

Transimpedance amplifiers are used to amplify and convert current signals to voltage signals. The input current source typically shows high impedance at low frequencies, which in most applications is shunted by parasitic capacitances. These capacitances lower the source impedance at higher frequencies. As a result it is advantageous for a transimpedance amplifier to provide low input impedance over a wide frequency range.

In broadband fiber-optical data transmission systems, transimpedance amplifiers are, for example, driven by photodiodes. In dependence of the light intensity at the fiber input and dependent on the length and the quality of the fiber interconnect the current generated by the photodiode can vary by several orders of magnitude.

In order to achieve good noise performance, the transimpedance of the amplifier needs to be maximized as far as possible, which is typically limited by the amplifier bandwidth requirements. State of the art transimpedance amplifiers in today's data transmission systems require low supply voltages, e.g. 5V, 3.3V or below. These three requirements—high input-current dynamic-range, high transimpedance and low supply voltage, lead to problems in transimpedance amplifiers of the prior art, which will be discussed in detail with reference to the prior art transimpedance amplifiers shown in FIGS. 1a, 1b and 1c.

The prior art transimpedance amplifier in FIG. 1a consists of an input transistor Q1, a load resistor RL, an output transistor Q2, a constant current source I1 and a feedback resistor RF. The input current is applied to the base of the common emitter transistor Q1. The collector of this transistor is connected to the positive supply voltage VCC using a load resistor RL. The base of the emitter follower transistor Q2 is connected to the collector of Q1. The collector of Q2 is connected to the supply voltage. The emitter of this transistor is driven by the constant current source I1. A voltage controlled current feedback is provided by means of a feedback resistor, which is connected between the emitter of Q2 and the base of Q1. The output voltage VOUT is available at the emitter of Q2.

Assuming a base emitter voltage drop of about 900 mV, which is a typical value for state of the art bipolar circuit technologies, the voltage at the base node of Q1 is 900 mV referred to ground. With no input current signal IIN and neglecting the finite current gain of Q1 (i.e. assuming IBQ1=0), the output voltage VOUT also equals 900 mV. In a typical fiber optical transmission system operating in the Gbps-region, the input current values show a wide dynamic range from e.g. 10 $\mu$A up to 2 mA. In order to provide sufficient sensitivity and gain, the feedback resistor RF should be about 5 k$\Omega$. Consequently, at the maximum input current IIN=2 mA, the voltage drop across the feedback resistor RF would be 10V. The corresponding theoretical output voltage would be −9.1V, which is obviously impossible with a single positive 5.0 or 3.3V power supply.

Any limitation of the dynamic range is undesirable for most applications. Also providing dual voltage sources in order to extend the dynamic range is expensive and not practical. Therefore, in order to overcome this problem other state of the art transimpedance amplifiers use MOSFET devices in adaptive feedback loops. These MOSFET devices are coupled across resistors and thus limiting or clamping the output voltage of the transimpedance amplifier. An example of such kind of transimpedance amplifier is disclosed in U.S. Pat. No. 5,532,471: "Optical Transimpedance Amplifier With High Dynamic Range" by H. Khorramabadi et al. FIG. 1 of the named patent is reproduced herein as FIG. 1b (prior art). Such kind of solutions have several drawbacks. For monolithic integration they require a BiCMOS process with both bipolar and CMOS devices being realized on a single substrate, which is a costly solution. Additionally, this solution requires a low frequency adaptation loop, which may lead to insufficient performance if the level of the input current varies rapidly, as in burst mode applications.

The same disadvantages hold for the approach disclosed in U. S. Pat. No. 6,583,671 B2: "Stable AGC Transimpedance Amplifier With Expanded Dynamic Range" by J. G. Chatwin. Which also uses MOSFET devices in parallel to the transimpedance feedback resistor.

A different approach is used in U.S. Pat. No. 5,708,292: "Method And Apparatus For Providing Limiting Transimpedance Amplification" by W. A. Gross. FIG. 2 of the named patent is reproduced herein as FIG. 1c (prior art). the voltage drop across the feedback resistor RF is limited by diodes or preferably Schottky-type diodes. Compared to the MOSFET solution described above, the advantages of this approach are the simplicity, the inexpensiveness and the suitability for input signals with rapidly changing amplitude levels. However, this solution suffers from several disadvantages: While diodes are always available in bipolar technologies, the preferred Schottky diodes do not exist in modem bipolar technologies, because in today's technologies for connection of the devices polysilicon is used below the metallization. The voltage drops across diodes, however, equals the base-emitter voltage drop of bipolar transistors, leading to operating point problems in the circuit given in figure 1c. Furthermore, the diode voltage drop is highly temperature dependent. Therefore in limiting operation the output voltage of the circuit given in figure 1c decreases strongly with increasing temperature.

SUMMARY OF THE INVENTION

An improved transimpedance amplifier is provided to overcome the limitations described above in reference to the prior art. In accordance with an embodiment of the present invention an improved transimpedance amplifier circuit is provided that limits the voltage drop across the feedback resistance. The circuit includes a transimpedance amplifier consisting of transistors, a constant current source, a load resistor, and a feedback resistor with shunt circuitry consisting of two additional transistors, which are driven for example with electrically adjustable voltage sources. The electrically adjustable voltage sources could also be dynamically adjusted.

In a bipolar all npn implementation the amplifier stage consists of a common emitter input transistor, with the input current signal IIN connected to the base node and the collector of said transistor connected to the positive supply voltage by means of a load resistor. A second transistor with its base connected to the collector of the first transistor operates as an emitter follower. The collector of the second transistor is connected to the positive supply voltage, while the emitter is driven by a current source connected to ground. A resistor connected between the emitter of said second transistor and the base of said first transistor provides a voltage controlled current feedback from the amplifier output to its input. The output voltage VOUT is generated at the emitter node of said second transistor.

The shunt circuitry consists of a third and a fourth transistor, with the emitter of third transistor and the collector of forth transistor both connected to the emitter of the second transistor and the collector of third transistor and the emitter of forth transistor both connected to the base node of the first transistor. The base node voltages of the third and forth transistors may be adjusted by two control voltage sources.

An advantage of embodiments of the present invention is that it is portable to virtually any circuit integration process including non-silicon technologies.

Another advantage of embodiments of the present invention is the limited output amplitude can be designed with arbitrary dependencies on parameters such as temperature and supply voltage.

An additional advantage of embodiments of the present invention is that parasitic effects, such as pulse width distortion in overload condition caused by different rise and fall times, can be compensated.

DETAILED DESCRIPTION OF THE INVENTION

Figure 1A:
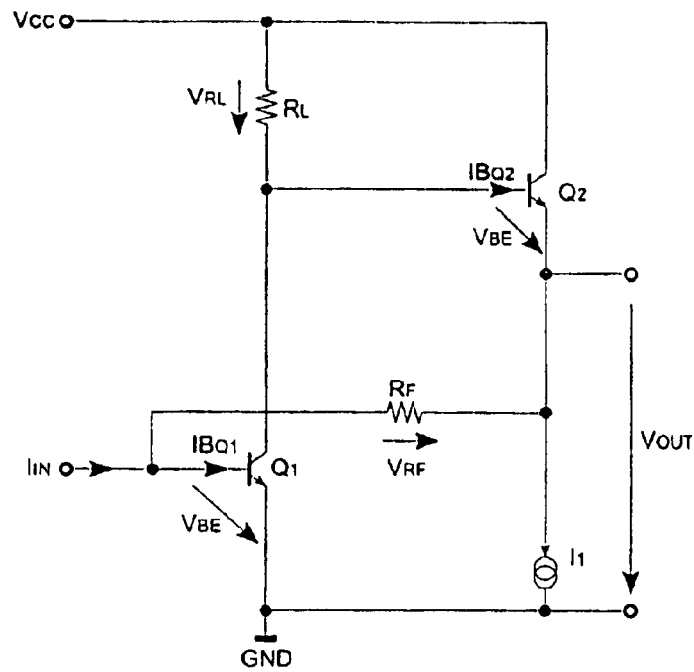
FIG. 1a is a schematic of a transimpedance amplifier of the prior art.
Figure 1B:
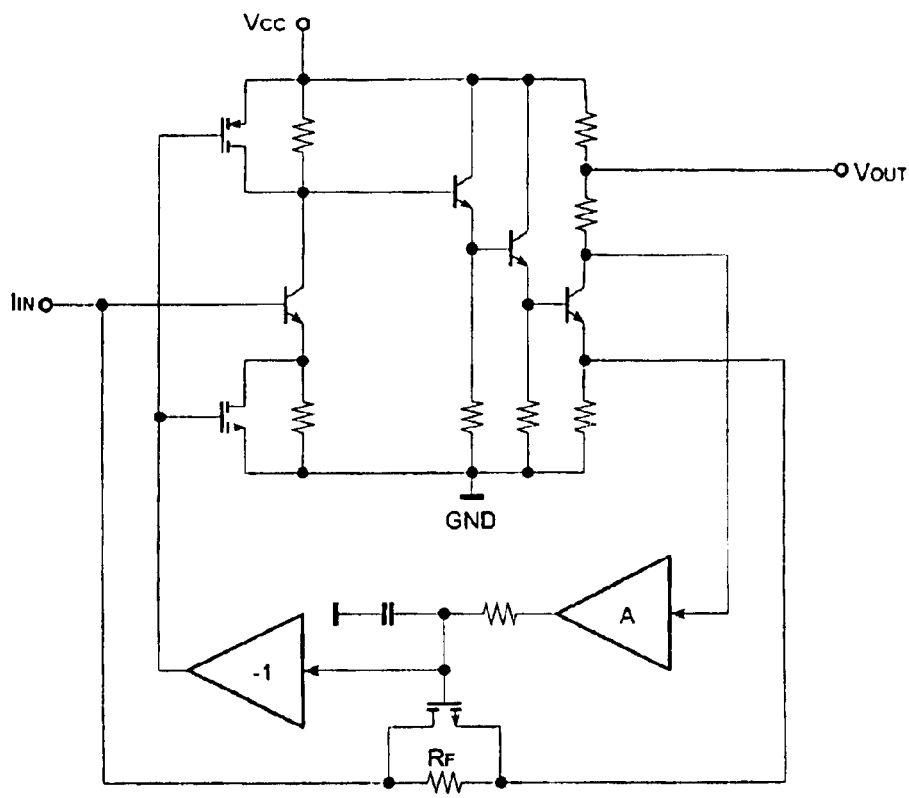
FIG. 1b is a schematic of a prior art transimpedance amplifier with automatic gain control using a MOSFET device.
Figure 1C:
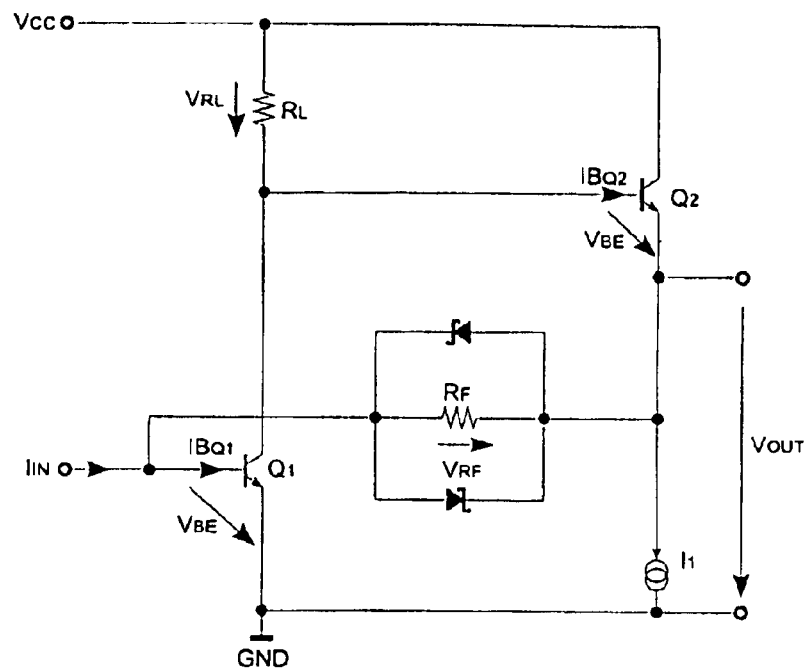
FIG. 1c is a schematic of a prior art transimpedance amplifier using a diode clamping structure.
Figure 2:
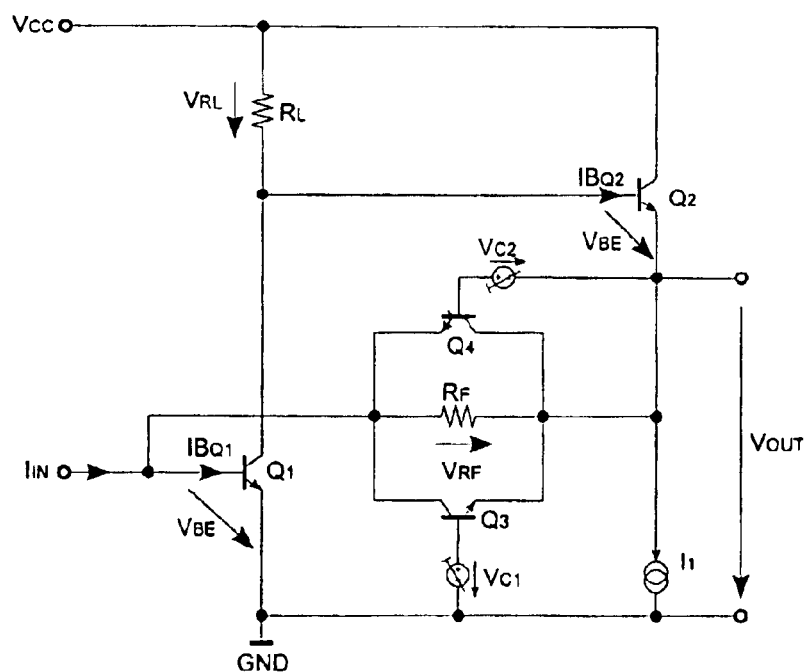
FIG. 2 is the basic schematic illustrating a method of realizing a transimpedance amplifier with adjustable limited output voltage in accordance with the present invention.

An integratable transimpedance amplifier with adjustable limited output voltage and wide input-current dynamic range according to an embodiment of the present invention is shown in FIG. 2. The circuit arrangement includes a transimpedance amplifier consisting of transistors, a constant current source a load resistor and the feedback resistor with a shunt circuitry consisting of the additional transistors, which are driven for example with electrically adjustable voltage sources.

The embodiment shown in FIG. 2 provides a bipolar all npn implementation of the present invention. The amplifier stage consists of a common emitter input transistor Q1, with the input current signal IIN connected to the base node, and the collector of said transistor connected to the positive supply voltage VCC by means of a load resistor RL. A second transistor Q2 with its base connected to the collector of the first transistor operates as an emitter follower. The collector of the second transistor Q2 is connected to the positive supply voltage while the emitter is driven by a current source I1 connected to ground. A resistor RF connected between the emitter of said second transistor and the base of said first transistor provides a voltage controlled current feedback from the amplifier output to its input. The output voltage VOUT is generated at the emitter node of said second transistor.

A shunt circuitry consists of a third and a fourth transistor Q3 and Q4, respectively, with the emitter of Q3 and the collector of Q4 both connected to the emitter of the second transistor Q2 and the collector of Q3 and the emitter of Q4 both connected to the base node of the first transistor Q1. The base node voltages of the said transistors Q3 and Q4 may be adjusted by control voltage sources VC1 and VC2, respectively. With VC1 connected between the base of said third transistor Q3 and ground (GND) and with VC2 connected between the base of said forth transistor Q4 and the emitter of the second transistor Q2.

By means of an appropriate implementation of these voltage sources VC1 and VC2 the maximum and minimum limits of the output voltage VOUT is defined, which can easily be implemented with arbitrary temperature or supply voltage dependency.

Assuming a constant base emitter voltage drop VBE for normal operation of Q1 and Q4 in case if high input currents IIN, the maximum output voltage VOUT,MAX of the circuit in FIG. 2 can be approximated as follows:

$$VOUT,MAX = 2 \cdot VBE - VC2 \qquad (1)$$

The minimum output voltage assuming a constant base emitter voltage drop VBE for normal operation of Q3 in case if high negative input currents IIN can be approximated the following equation:

$$VOUT,MIN = VC1 - VBE \qquad (2)$$

Neglecting the base current of Q1 limiting of the output voltage occurs for positive values IIN calculated as follows:

$$V_{OUT} = V_{OUT,MIN} \text{ for } I_{IN} \geq \frac{V_{C1} - V_{BE}}{R_F} \qquad (3)$$

The condition for a limited output voltage when applying a negative input current is given in (4):

$$V_{OUT} = V_{OUT,MAX} \text{ for } I_{IN} \leq \frac{2 \cdot V_{BE} - V_{C2}}{R_F} \qquad (4)$$

Depending on the temperature coefficients of the control voltages VC1 and VC2, the minimum and maximum limit of the output voltage VOUT can be realized arbitrarily with positive, negative or without temperature dependency. Furthermore a dependency on any other electrical variable, like e.g. supply voltage, can easily be implemented.

Since limiting of the output voltage does not require a low speed control loop, the circuit according to this invention is suitable for applications with level of the input current varying rapidly, as in burst mode systems.

The minimum and the maximum limit of the output voltage VOUT can be adjusted independently. Furthermore arbitrary dependencies on temperature, supply voltage or any other electrical parameter may differ for both control voltages VC1 and VC2.

As a result unwanted parasitic effects including but not limited to pulse width distortion caused by different rise and fall times of the output voltage can be compensated using different voltage levels for the control voltages VC1 and VC2 as well as different dependencies of these voltages from other parameters, if required.

Figure 3:
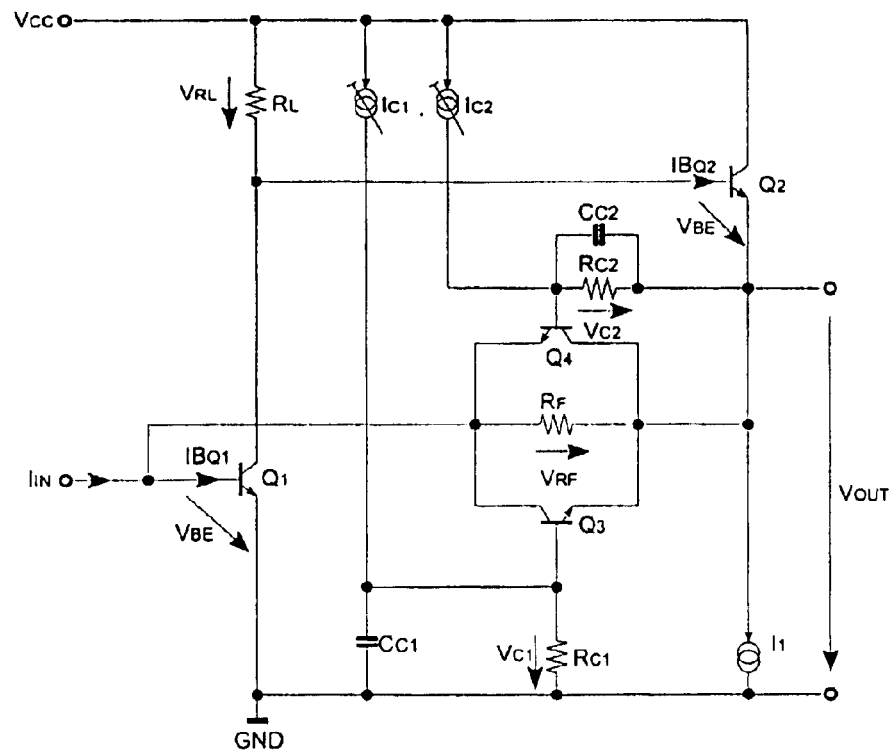
FIG. 3 is a schematic of an alternative embodiment of a transimpedance amplifier with adjustable limited output voltage in accordance with the present invention.

Another embodiment according to this invention is shown in FIG. 3. This embodiment is based of the structure described with reference to FIG. 2, however, the voltage sources VC1 and VC2 from FIG. 2 are replaced here with resistors RC1 and RC2, respectively. The voltage drop across these resistors is defined by the adjustable current sources IC1 and IC2. For filtering purposes capacitors CC1 and CC2 may be included in parallel to RC1 and RC2, respectively.

Figure 4:
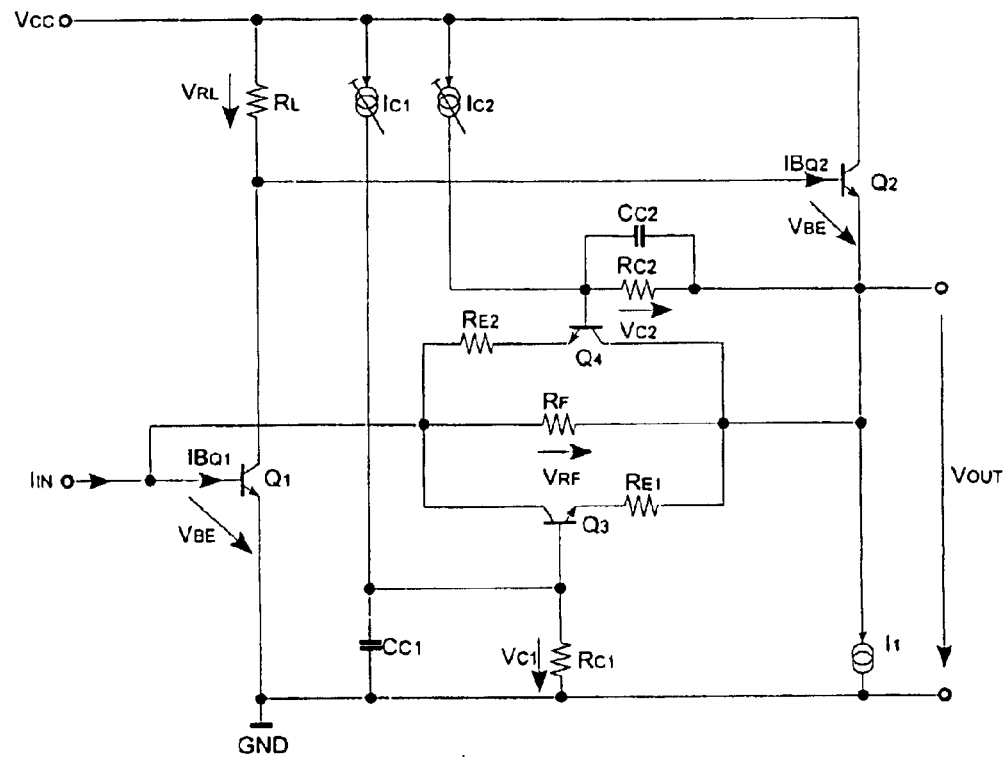
FIG. 4 is a schematic of an alternative enhanced embodiment of a transimpedance amplifier with adjustable limited output voltage in accordance with the present invention.

Another embodiment of an integratable transimpedance amplifier with adjustable limited output voltage and wide input-current dynamic range according to this invention is shown in FIG. 4. This embodiment is similar to the structure in FIG. 3. This embodiment includes emitter series feedback resistors in the shunt structure. One resistor RE1 is connected between the emitter of Q3 and the emitter of Q2. A second resistor RE2 is connected between the emitter of Q4 and the base of Q1. This embodiment is advantageous where soft limiting of the output voltage is required in the intended application. For input currents beyond the limits defined in (3) and (4) the transimpedance resistor is reduced as given in (5) below:

$$R_{F,OVLD} = \frac{R_F \cdot \left(\frac{V_T}{I_{IN}} + R_E\right)}{R_F + \frac{V_T}{I_{IN}} + R_E} \text{ for } I_{IN} \geq \frac{V_{C1} - V_{BE}}{R_F} \text{ or } I_{IN} \leq \frac{2 \cdot V_{BE} - V_{C2}}{R_F} \quad (5)$$

In (5) VT represents the thermal voltage and RE either equals RE1 or RE2 depending on the polarity of the input current IIN.

Figure 5:
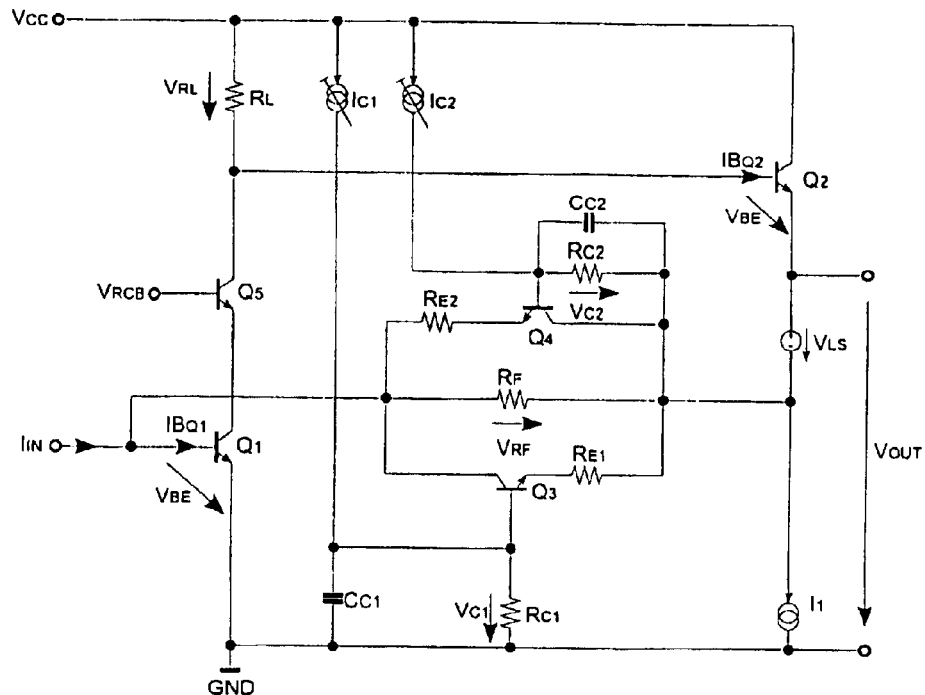
FIG. 5 is a schematic of an alternative enhanced embodiment of a transimpedance amplifier with adjustable soft limited output voltage in accordance with the present invention.

A further embodiment of the present invention is shown in FIG. 5, which is based on the circuitry in FIG. 4. This embodiment is advantageous for applications with high bandwidth requirements. The emitter of an additional common base transistor Q5 is connected to the collector of Q1. The collector of the said additional transistor Q5 is connected via the load resistor RL to the positive supply VCC. The base potential of the transistor Q5 is connected to a reference voltage VRCB. In order to guaranty enough headroom for Q5 an additional voltage source VLS is required in series to the emitter follower Q2. The said voltage source VLS is connected between the emitter of Q2 and the current source I1.

Figure 6:
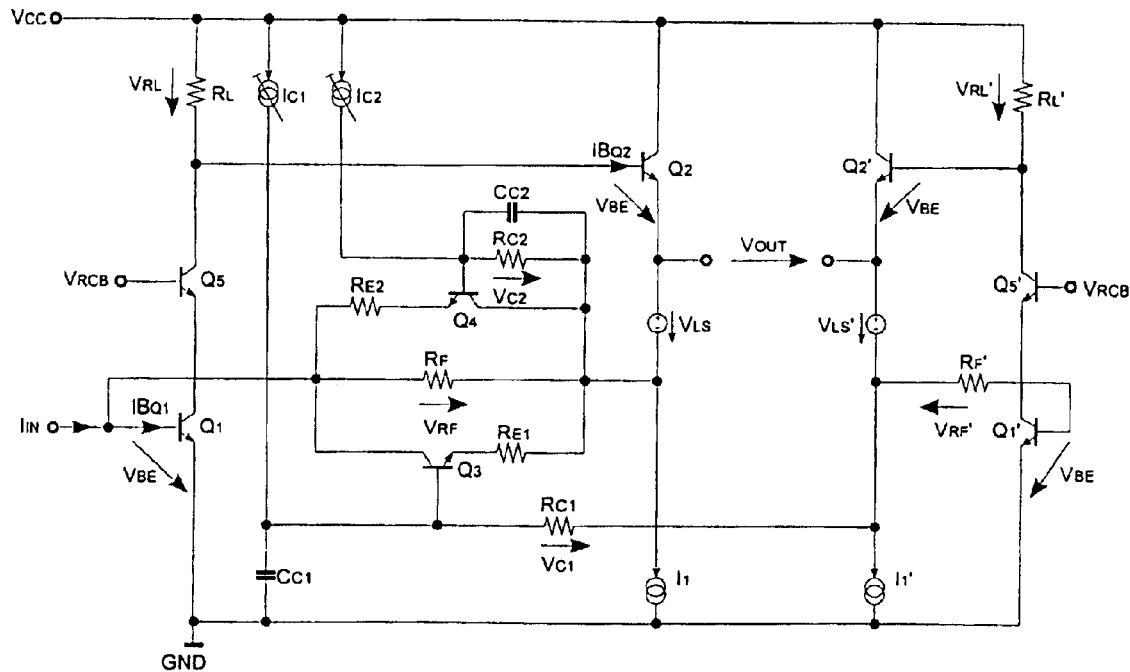
FIG. 6 is a schematic of an alternative enhanced embodiment of a transimpedance amplifier in accordance with the present invention, which includes an improved control voltage generation.

Another embodiment of the present invention is given in FIG. 6. This embodiment is advantageous In applications where the output of the transimpedance amplifier is used to drive a differential input of the following circuit. A dummy stage is realized as a reference for the output signal. The collector of a common emitter transistor Q1' is connected to the emitter of a common base transistor Q5'. The base node of Q5' is driven by a reference voltage VRCB. The collector of the common base transistor Q5' is connected to VCC via a load resistor RL'. The base of an emitter-follower Q2' is connected to the collector of the common base transistor Q5'. The collector of the said emitter-follower Q2' is connected to the positive supply VCC. In series to the emitter of Q2' a voltage source VLS' is used. The series connection of Q2' and VLS' is fed by a constant current source I1' connected to ground (GND). A feedback resistor RF' provides voltage controlled current feedback from I1' to the base node of Q1'. The output voltage of this transimpedance amplifier is available between the emitter nodes of Q2 and Q2'.

Other Embodiments

Although the present invention has been described in detail, it should be understood that various changes, substitutions, and alterations could be made hereto without departing from the spirit and scope of the invention as defined by the appended claims.

The transimpedance amplifier according to the present invention is not limited to specific technologies. It can be implemented in all bipolar or BiCMOS technologies. Further, it is not limited to silicon bipolar technologies, but can also be used in SiGe, GaAs, InP or any other semiconductor technology. Furthermore, it can be implemented accordingly for inverted polarity using pnp instead of npn devices. Finally, the circuit concept can be used identically in MOSFET or MESFET technologies, by replacing npn with n-channel and pnp with p-channel devices. A theoretical transistor is used to generalize all these transistor types. This theoretical transistor has an control input that would be the gate/base, and a second and third terminal that would be the source and drain, or the emitter and collector.

The limited output voltage of this arrangement is easily adjustable with the two control voltage sources. Arbitrary dependencies on temperature, supply voltage or any other electrical parameter may be realized depending on the intended application. Furthermore, pulse width distortion caused by different rise and fall times of the output voltage can be compensated using different voltage levels for the control voltages defining the minimum and the maximum output voltage.

What is claimed is:

1. A transimpedance amplifier circuit with limited output voltage and wide input-current dynamic-range comprising:
   a. an first transistor, with an input current signal connected to a control terminal and a second and third terminal;
   b. a second transistor with a control terminal connected to the second terminal of the first transistor providing an output voltage at a second terminal, and a third terminal of said second transistor being connected to a positive supply voltage,
   c. a resistor connected between the second terminal of the second transistor and the control terminal of the first transistor providing a voltage controlled current feedback from the amplifier output to its input, and
   d. a shunt circuit in parallel to the feedback resistor comprising a third and a fourth transistor each having an control terminal, with a second terminal of both third and fourth transistor connected to the second terminal of the second transistor and the third terminal of both third and forth transistor connected to the control terminal of the first transistor.

2. The transimpedance amplifier circuit according to claim 1, further characterized in that and the second terminal of said second transistor is driven by a first current source connected to ground.

3. The transimpedance amplifier circuit according to claim 1, further characterized in that and the control terminals of the third and fourth transistors are adjusted by first and second control voltage sources.

4. The transimpedance amplifier circuit according to claim 3, further characterized in that the first and second control voltage sources are dynamically adjusted.

5. The transimpedance amplifier circuit according to claim 3, further characterized in that the first control voltage source is connected between the control terminal of said third transistor and ground (GND) and the second control voltage source connected between the control terminal of said forth transistor and the second terminal of the second transistor.

6. The transimpedance amplifier circuit according to claim 1, further characterized in that and the control terminals of the said third and fourth transistors being adjusted by second and third resistors, respectively, with the required voltage drop across these resistors being defined by a first and second adjustable current source.

7. The transimpedance amplifier circuit according to claim 6 further comprising first and second filter capacitors connected in parallel to said second and third resistors, respectively.

8. The transimpedance amplifier circuit according to claim 1 characterized in that a first and second emitter series feedback resistor is used in the shunt structure with said third and fourth transistor respectively and connected in series with said third and fourth transistor.

9. The transimpedance amplifier circuit according to claim 1 further comprising a fifth transistor connected between the load resistor RL connected to the positive supply and the first terminal of the first transistor, with the control terminal of the fifth transistor being defined by a first reference voltage.

10. The transimpedance amplifier circuit according to claim 1 characterized in that a third voltage source is connected between the second terminal of the second transistor and the first current source.

11. The transimpedance amplifier circuit according to claim 1 characterized in that a dummy stage is realized as a reference for the output signal.

12. The transimpedance amplifier circuit according to claim 11 wherein the dummy stage further comprises a collector of a common emitter transistor being connected to the emitter of a common base transistor and the base node of said common base transistor being driven by a reference voltage, while the collector of the common base transistor is connected to VCC via a load resistor, and an emitter-follower transistor with the base connected to the collector of the common base transistor and a collector of the said emitter-follower transistor being connected to the positive supply VCC, and a voltage source being used in series to the emitter of follower transistor and the series connection of the emitter follower transistor and the voltage source being fed by a constant current source connected to ground, and with a feedback resistor providing voltage controlled current feedback from the current source to the common emitter transistor.

13. The transimpedance amplifier circuit according to claim 1 characterized in that all transistor devices are npn transistor devices.

14. The transimpedance amplifier circuit according to claim 1 characterized in that all transistor devices are pnp transistor devices and that a negative supply voltage is used to operate the circuit.

15. The transimpedance amplifier circuit according to claim 1 characterized in that all transistor devices are n-channel MOSFET devices.

16. The transimpedance amplifier circuit according to claim 1 characterized in that all transistor devices are n-channel MESFET devices.

17. The transimpedance amplifier circuit according to claim 1 characterized in that all transistor devices are p-channel MOSFET devices and that a negative supply voltage is used to operate the circuit.

18. The transimpedance amplifier circuit according to claim 1 characterized in that all transistor devices are p-channel MESFET devices and that a negative supply voltage is used to operate the circuit.

19. A transimpedance amplifier circuit with limited output voltage and wide input-current dynamic-range comprising:
   a. a common emitter input transistor Q1, with the input current signal IIN connected to the base node;
   b. a load resistor RL connecting the collector of said common emitter input transistor to the positive supply voltage VCC;
   c. a second transistor Q2 operating as an emitter follower providing the output voltage VOUT at its emitter and with its base connected to the collector of the first transistor Q1 an the collector of said second transistor being connected to the positive supply voltage while the emitter is driven by a current source I1 connected to ground;
   d. a resistor RF connected between the emitter of said second transistor and the base of said first transistor providing a voltage controlled current feedback from the amplifier output to its input, and
   e. a shunt circuit in parallel to the feedback resistor RF comprising a third and a fourth transistor Q3 and Q4, respectively, with the emitter of Q3 and the collector of Q4 both connected to the emitter of the second transistor Q2 and the collector of Q3 and the emitter of Q4 both connected to the base node of the first transistor Q1 and the base node voltages of the said transistors Q3 and Q4 being adjusted by control voltage sources VC1 and VC2, respectively, with VC1 connected between the base of said third transistor Q3 and ground (GND) and with VC2 connected between the base of said forth transistor Q4 and the emitter of the second transistor Q2.

20. The transimpedance amplifier circuit according to claim 19, further characterized in that VC1 and VC2 are replaced by resistors RC1 and RC2, respectively, with the required voltage drop across these resistors being defined by the adjustable current sources IC1 and IC2.

21. The transimpedance amplifier circuit according to claim 20 further comprising additional filter capacitors CC1 and CC2 included in parallel to RC1 and RC2, respectively.

22. The transimpedance amplifier circuit according to claim 19 characterized in that emitter series feedback resistors RE1 and RE2 are used in the shunt structure with RE1 being connected between the emitter of Q3 and the emitter of Q2 and RE2 being connected between the emitter of Q4 and the base of Q1.

23. The transimpedance amplifier circuit according to claim 19 characterized in that an additional common base transistor Q5 is connected to the collector of Q1 with the collector of the said additional transistor Q5 being connected via the load resistor RL to the positive supply VCC and the base potential of the transistor Q5 being defined by a reference voltage VRCB.

24. The transimpedance amplifier circuit according to claim 19 characterized in that an additional voltage source VLS is included in series to the emitter follower Q2 with said voltage source VLS is connected between the emitter of Q2 and the current source I1.

25. The transimpedance amplifier circuit according to claim 19 characterized in that a dummy stage is realized as a reference for the output signal VOUT with the collector of a common emitter transistor Q1' being connected to the emitter of a common base transistor Q5' and the base node of said transistor Q5' being driven by a reference voltage VRCB, while the collector of the common base transistor Q5' is connected to VCC via a load resistor RL' and the base of an emitter-follower Q2' is connected to the collector of the common base transistor Q5' with the collector of the said emitter-follower Q2' being connected to the positive supply VCC and a voltage source VLS' being used in series to the emitter of Q2' and the series connection of Q2' and VLS' being fed by a constant current source I1' connected to ground (GND) and with a feedback resistor RF' providing voltage controlled current feedback from I1' to the base node of Q1' and the output voltage of this transimpedance amplifier being available between the emitter nodes of Q2 and Q2'.

\* \* \* \* \*